United States Patent [19]
Liu

[11] Patent Number: 4,580,104
[45] Date of Patent: Apr. 1, 1986

[54] HIGH VOLTAGE OPERATIONAL AMPLIFIER

[75] Inventor: Raymond C. Liu, Norwalk, Conn.

[73] Assignee: The Perkin-Elmer Corporation, Norwalk, Conn.

[21] Appl. No.: 621,839

[22] Filed: Jun. 18, 1984

[51] Int. Cl.$^4$ ............................ H03F 3/38; H03F 1/34
[52] U.S. Cl. .......................................... 330/10; 330/75
[58] Field of Search .................. 330/9, 10, 75, 195, 330/196

[56] References Cited

U.S. PATENT DOCUMENTS 4,506,230  3/1985  Ashley-Rollman .................... 330/10

FOREIGN PATENT DOCUMENTS 44143  4/1977  Japan ...................................... 330/10

OTHER PUBLICATIONS

Leitman et al., "High-Speed High-Voltage DC Amplifier with Conversion", *Instrum. & Exp. Tech.*, (USA), vol. 19, No. 6, PT-1, Nov.-Dec. 1976, (published May 1977), pp. 1679-1681.

*Primary Examiner*—James B. Mullins
*Attorney, Agent, or Firm*—Thomas P. Murphy; Edwin T. Grimes

[57] ABSTRACT

A d.c. high voltage operational amplifier. The output of a conventional power operational amplifier is converted to a.c. which is stepped up by a transformer and then rectified to provide a high voltage d.c. output. Appropriate feedback circuitry is utilized to stabilize the overall operational amplifier against oscillation and provide substantially perfect linearity between the input and output voltages of the high voltage operational amplifier when incorporating negative feedback.

5 Claims, 3 Drawing Figures

HIGH VOLTAGE OPERATIONAL AMPLIFIER

BACKGROUND OF THE INVENTION

In order to provide output voltages of a thousand or more volts, conventional solid-state high voltage operational amplifiers must utilize a multiple cascode circuit with high voltage transistors between the output of an operational amplifier and the load. Use of high voltage transistors inherently require the use of a high voltage power supply. In addition, such circuits require feedback and bias circuits and protection circuits and often suffer from low d.c. forward sequence gains. Thus, such conventional high voltage operational amplifiers are bulky, costly, have heat disipation problems and are therefore, unsuitable for many present day applications which require compact and inexpensive high voltage operational amplifiers.

The present invention overcomes the foregoing disadvantages and provides an improved high voltage operational amplifier eliminating entirely the requirement of high voltage transistors and a high voltage power supply.

BRIEF DESCRIPTION OF THE INVENTION

The present invention relates to a high voltage d.c. operational amplifier combining a power operational amplifier and variable d.c. to d.c. converter to provide a high gain with substantially perfect linearity between input and output voltge when incorporating negative feedback. The d.c. to d.c. converter comprises a chopper, step-up transformer with a rectified output connected in series to the output of the operational amplifier. The operational amplifier is stabilized by a compensation circuit and the linearity of the d.c. to d.c. converter is enhanced by a feedback circuit between the output of the d.c. to d.c. converter and the input of the operational amplifier.

DESCRIPTION

Figure 1:
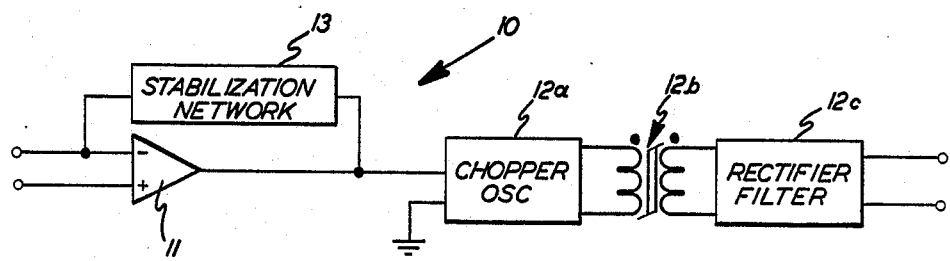
FIG. 1 is a block diagram of a generic embodiment of the high voltage operational amplifier of the present invention.

Referring now to FIG. 1, there is shown the high voltage operational amplifier 10 of the present invention. It comprises generally a power operational amplifier 11 having its output connected to a variable d.c. to d.c. converter 12. The operational amplifier 11 may be of the type sold by Burr-Brown under model no. 3571/3572. Likewise, the variable d.c. to d.c. converter is also commercially available from, e.g., Venus Scientific under model no. K-15/30.

The variable d.c. to d.c. converter comprises a chopper oscillator 12a, a step-up transformer 12b and a rectifier filter 12c. The power operational amplifier 11 has a very high d.c. gain, e.g., it may have a gain of 100,000 or more.

The additional gain and phase shift introduced by the d.c. to d.c. converter 12, may be compensated by stabilization circuit 13 connected between the input and output of the power operational amplifier 11 which prevents instability and eliminates oscillation of the overall amplifier system. Where the frequency response time characteristics of the circuit are not critical, stabilization circuit 13 may be a capacitor. Where speed of response in the output signal and operation over a wide bandwidth are of importance, the feedback circuit would be a more elaborated lag-lead network.

An input voltage as either the positive or negative input side of operational amplifier 11 appears at the output of rectifier 12c dependent on the cumulative gain of operational amplifier 11 and d.c. to d.c. converter 12.

Presently available variable d.c. to d.c. converters have the disadvantages of poor regulation and linearity as well as high ripple and relatively narrow dynamic range which in the present invention is improved by feedback circuitry as more fully explained hereinbelow.

Although many applications with high voltage operational amplifier are possible by suitable choice of feedback to input impedance ratio, the applications often fall into the category of the voltage amplification.

Figure 2:
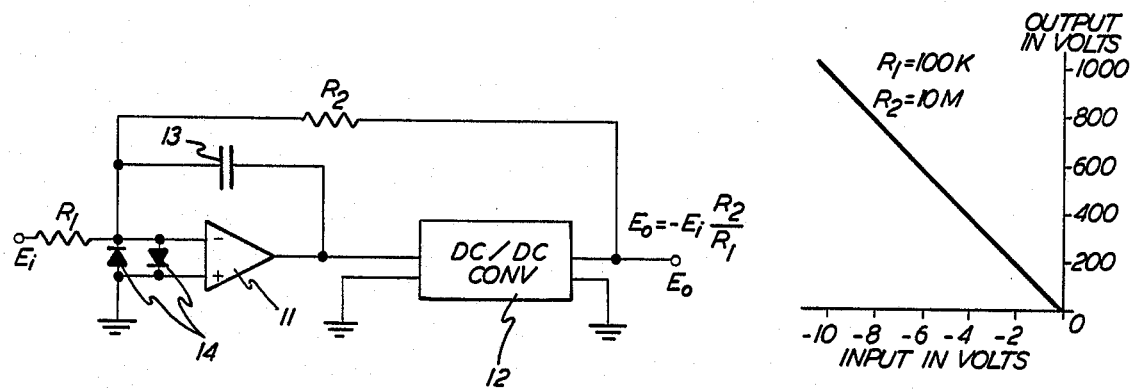
FIG. 2 is a view partly in schematic and block diagram form showing an inverting amplifier of the present invention; and, FIG. 3 is a view partly in schematic and partly in block diagam form showing a non-inverting amplifier of the present invention.
Figure 2:
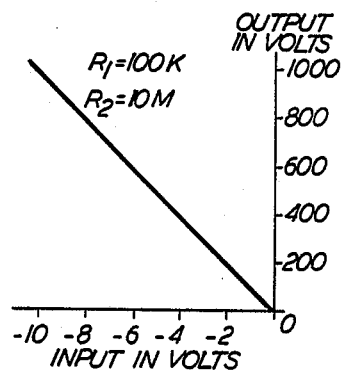

Referring to FIG. 2, there is shown a high voltage inverting operational amplifier version of the present invention. The stabilization feedback circuit 13 is shown as a capacitor connected between the negative input and output of the operational amplifier 11. An input resistance $R_1$ is connected between the source of input voltage (not shown) and the negative input of the operational amplifier. Diodes 14 are connected between the positive and negative input terminals of the operational amplifier 11 to protect it from damaging excessive input voltages.

A feedback resistor $R_2$ is connected between the output of d.c. to d.c. converter 12 to a junction point between the resistance $R_1$ and the negative input of the operational amplifier 11.

As aforesaid, a d.c. to d.c. converter 12 has relatively poor linearity. However, by use of a very high gain operational amplifier with negative feedback, the linearity of the system can be made practically perfect in linearity between the input and output voltages of the high voltage operational amplifier of the present invention. For the inverting high voltage operational amplifier of the present invention the ratio of output voltage $E_0$ to input voltage $E_i$ is equal to the constant ratio of the feedback resistance $R_2$ to the input resistance $R_1$ if the open-loop gain is much greater than unity.

Figure 3:
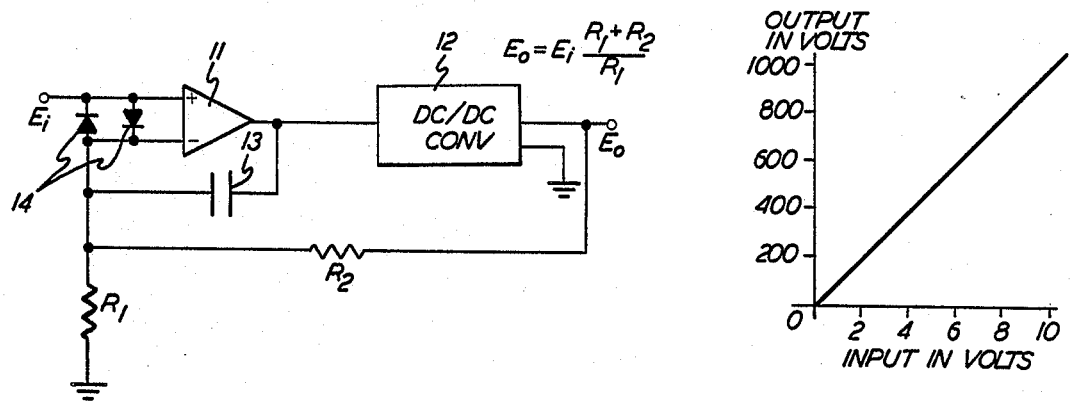
Figure 3:
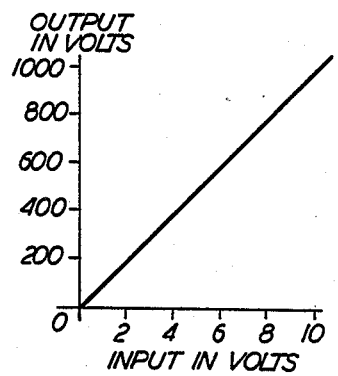

FIG. 3 is a high voltage operational amplifier which differs from that of FIG. 2 in that it is of the non-inverting type. The input voltage $E_i$ is applied directly to the positive input of the operational amplifier 11 with resistance $R_1$ connected between ground and the negative input of operational amplifier 11. The feedback resistance $R_2$ is connected from the output of d.c. to d.c. converter 12 and to a junction point between the resistance $R_1$ and the negative input to the operational amplifier 11. Since the circuit of FIG. 3 has a very high gain, the ratio of output voltge to input voltage equals $(R_1+R_2)R_1$. Thus, if the value of the open-loop gain is much greater than unity, the value of the closed-loop gain depends on the two resistors.

The present invention is, therefore, a high voltage operational amplifier having a substantially perfect linearity capable of providing a gain in output voltage at least as good as conventional high voltage operational amplifiers without the requirements of several cascoded voltage transistors and which does not require a high voltage power supply which substantially lowers cost, size, weight, and heat generation associated with conventional high voltage operational amplifiers.

Other modifications of the present invention are possible in light of the foregoing description which should not be construed as placing limitations on the present invention beyond those set forth in the claims which follow.

What is claimed is:

1. A high voltage operational amplifier, comprising:
   an operational amplifier having input and output means,
   variable d.c. to d.c. converter means having an input connected to the output means of said operational amplifier and an output,
   a feedback resistor connected between the output of said d.c. to d.c. converter and the input means of said operational amplifier providing substantially perfect linearity between a d.c. voltage applied to said input means of said operational amplifier and the resulting d.c. voltage appearing at the output of said d.c. to d.c. converter,
   stabilizing means comprising a capacitor connected between the output and input means of said operational amplifier.

2. A high voltage operational amplifier according to claim, 1 wherein said input means of said operational amplifier comprises:
   positive and negative input terminals,
   a first resistance connected to said negative input terminal,
   said capacitor and feedback resistor connected to a junction between said first resistance and said negative input terminal whereby the voltage on the output of said d.c. to d.c. converter substantially equals the voltage applied to the input means of said operational amplifier times the ratio of the value of said feedback resistor to the value of said first resistance.

3. A high voltage operational amplifier according to claim 2 wherein said d.c. to d.c. converter comprises:
   chopper means for converting the output of said operational amplifier to an a.c. voltage,
   transformer means for stepping up the voltage output of said chopper means,
   rectifier means for converting the output of said transformer means to a d.c. voltage.

4. A high voltage operational amplifier according to claim 1 wherein said input means of said operational amplifier,
   comprises positive and negative input terminals,
   a second resistance connected between said negative input terminal and ground,
   said capacitor and feedback resistor connected to a junction between said second resistance and said negative input terminal whereby the voltage on the output of said d.c. to d.c. converter substantially equals the voltage applied to the input means of said operational amplifier times the ratio of the sum of the values of said feedback resistor and said second resistance to the value of said second resistance.

5. A high voltage operational amplifier according to claim 4 wherein said d.c. to d.c. converter comprises:
   chopper means for converting the output of said operational amplifier to an a.c. voltage,
   transformer means for stepping up the voltage output of said chopper means,
   rectifier means for converting the output of said transformer means to a d.c. voltage.

* * * * *